United States Patent
Hoehn et al.

(10) Patent No.: US 6,743,481 B2
(45) Date of Patent: Jun. 1, 2004

(54) PROCESS FOR PRODUCTION OF ULTRATHIN PROTECTIVE OVERCOATS

(75) Inventors: Joel W. Hoehn, Cottage Grove, MN (US); John W. Dykes, Eden Prairie, MN (US); James E. Angelo, Burnsville, MN (US); William D. Mosley, Savage, MN (US); Richard T. Greenlee, Hastings, MN (US); Brian W. Karr, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 104 days.

(21) Appl. No.: 09/871,004

(22) Filed: May 31, 2001

(65) Prior Publication Data

US 2002/0001680 A1 Jan. 3, 2002

Related U.S. Application Data

(60) Provisional application No. 60/208,873, filed on Jun. 1, 2000, provisional application No. 60/208,760, filed on Jun. 2, 2000, and provisional application No. 60/232,790, filed on Sep. 15, 2000.

(51) Int. Cl.[7] .............................. B05D 3/06; B05D 3/10; B05D 3/02
(52) U.S. Cl. ....................... 427/384; 427/534; 427/533; 427/336; 427/903; 427/554; 427/551; 216/66; 216/83; 216/65
(58) Field of Search ................................ 427/533, 534, 427/554, 555, 556, 558, 903, 336, 384, 552, 551; 216/65, 66, 83

(56) References Cited

U.S. PATENT DOCUMENTS

| | | | |
|---|---|---|---|
| 4,503,125 A | 3/1985 | Nelson et al. | 428/408 |
| 4,641,841 A | 2/1987 | Regan | 525/540 |
| 5,316,636 A | 5/1994 | Bunshah et al. | 204/157.47 |
| 5,374,463 A | 12/1994 | Bethune et al. | 428/64 |
| 5,447,796 A | 9/1995 | Tsukamoto et al. | 428/408 |

(List continued on next page.)

FOREIGN PATENT DOCUMENTS

| | | |
|---|---|---|
| FR | 2 461 997 | 7/1980 |
| JP | 05282660 | 10/1993 |
| JP | 05314451 | 11/1993 |
| JP | 05342570 | 12/1993 |
| JP | 06044556 | 2/1994 |

(List continued on next page.)

OTHER PUBLICATIONS

"Molecular Brush Assembly" *IBM Tech. Discl. Bull.* vol. #37, Issue #1, pp. 261–262.*

"The Evaluation of Carbon–60 as a Lubricant for Thin–Film Magnetic Disks" by R.D. Mitchel et al., Computer Mechanics Laboratory, Technical Report No. 92–024, Dec. 1992.

(List continued on next page.)

*Primary Examiner*—Marianne Padgett
(74) *Attorney, Agent, or Firm*—Westman, Champlin & Kelly, P.A.

(57) ABSTRACT

A multilayer coating of fullerene molecules is deposited on a substrate, and layers of the multilayer coating are removed leaving an approximate monolayer coating of fullerene molecules on the substrate. In some embodiments, a beam generator, such as an ion beam, electron beam or laser generator, produces a beam arranged to break the weaker fullerene-to-fullerene intermolecular bond of the multilayer coating and inadequate to break the stronger fullerene-to-substrate association/bond of the coating. The beam is directed at the multilayer coating to break the fullerene-to-fullerene intermolecular bond. In other embodiments, the monolayer of fullerene molecules is formed by applying a solvent to the multilayer coating to break the fullerene-to-fullerene intermolecular bond of the multilayer coating.

32 Claims, 2 Drawing Sheets

U.S. PATENT DOCUMENTS

| | | | | |
|---|---|---|---|---|
| 5,538,763 | A | | 7/1996 | Ueba et al. ............... 427/523 |
| 5,558,903 | A | | 9/1996 | Bhushan et al. ............ 427/11 |
| 5,744,399 | A | | 4/1998 | Rostoker et al. ........... 438/622 |
| 5,744,431 | A | | 4/1998 | Diaz et al. ................ 508/410 |
| 5,876,790 | A | | 3/1999 | Kats ........................ 427/122 |
| 5,886,854 | A | | 3/1999 | Diaz et al. ............... 360/99.08 |
| 6,017,630 | A | | 1/2000 | Tanaka et al. ............. 428/402 |
| 6,045,596 | A | | 4/2000 | Holland, Jr. et al. ....... 324/662 |
| 6,479,111 | B2 | * | 11/2002 | Dykes et al. .............. 427/595 |
| 6,586,069 | B2 | * | 7/2003 | Dykes et al. ............. 428/65.3 |
| 2002/0031615 | A1 | * | 3/2002 | Dykes et al. .............. 427/551 |
| 2003/0031619 | A1 | * | 2/2003 | Schleier-Smith et al. 423/447.1 |
| 2003/0112564 | A1 | * | 6/2003 | Granstrom ............. 360/324.12 |

FOREIGN PATENT DOCUMENTS

| | | |
|---|---|---|
| JP | 07235045 | 9/1995 |
| JP | 08212539 | 8/1996 |
| JP | 09211862 | 8/1997 |
| JP | 09211862 A | 8/1997 |
| JP | 10049885 | 2/1998 |
| JP | 11125904 | 5/1999 |

OTHER PUBLICATIONS

"Fullerene–Surface Interactions" by Alex V. Hamza, University of California, Lawrence Livermore National Laboratory, pp. 1–23, undated.

"Reaction and passivation of aluminum with $C_{40}$", by Alex V. Hamza et al., Surface Science 318 (1994), pp. 368–378, no month.

U.S. patent application Ser. No. 09/835,120, Dykes et al., filed Apr. 13, 2001.

"Molecular Ball Bearing system for Magnetic Head/Disc Interface", *IBM Technical Disclosure Bulletin*, vol. 37, No. 7, Jul. 1994.

Fartash, "Growth and Microstructure of Interfacially Oriented Large–Crystalline–Grain $C_{42}$ Sheets" *Applied Physics Letters*, vol. 64, No. 14, pp. 1877–1879 Apr. 4, 1994.

Altman et al., "Nucleation, Growth and Structure of Fullerene Films on Au (111)", *Surface Science*, No. 279, pp. 49–67, 1992, no month.

Sellidj et al., Vibrational and Electronic Properties of Monolayer and Mulilayer $C_{42}$ Films on Rh(111), *Journal of Physical Chemistry*, vol. 97, No. 39, pp. 10076–10082, 1993, no month.

Chen et al., "Growth of C60 Films on Silicon Surfaces", *Surface Science*, No. 318, pp. 74–82, 1994, no month.

Tannigaki et al., "Crystal Growth of $C_{42}$ thin films on layered substrates", Applied Physics Letters, vol. 63, No. 17, pp. 2351–2353, Oct. 25, 1993.

* cited by examiner

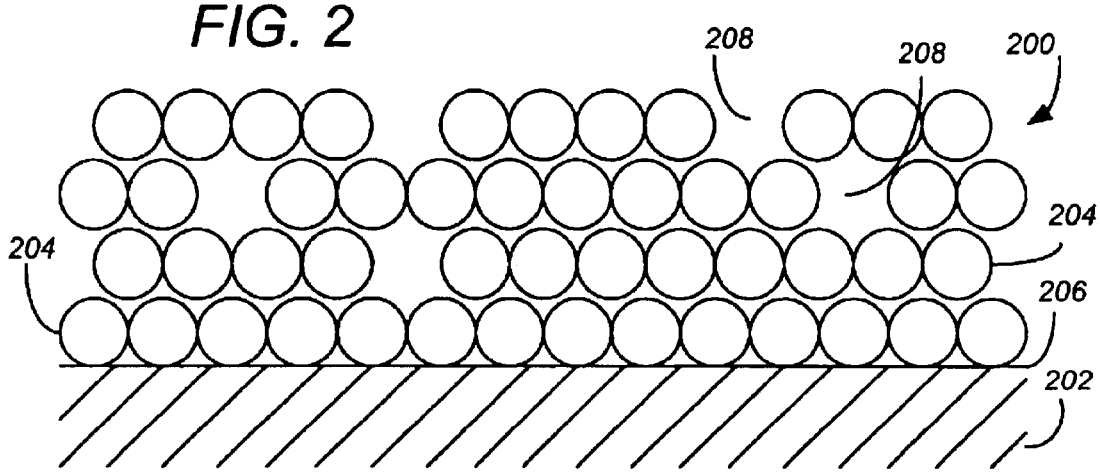
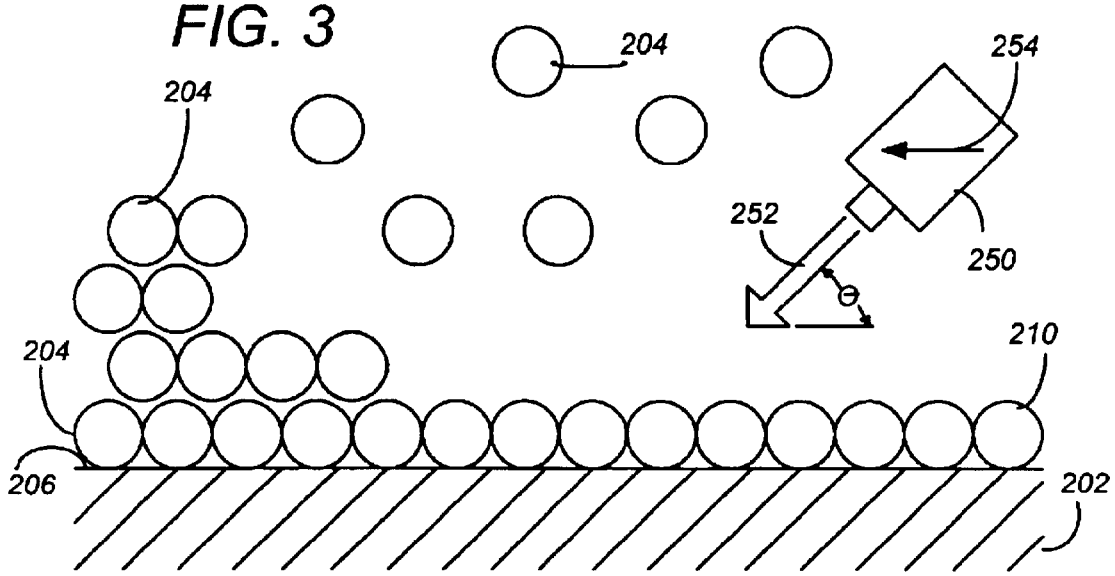
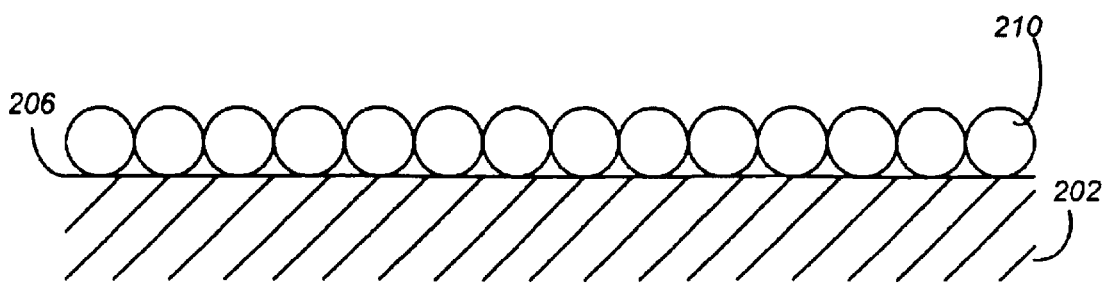

PROCESS FOR PRODUCTION OF ULTRATHIN PROTECTIVE OVERCOATS

CROSS-REFERENCE TO RELATED APPLICATION

This application claims priority of U.S. Provisional Patent Application No. 60/208,873 filed on Jun. 1, 2000, of U.S. Provisional Patent Application No. 60/208,760 filed Jun. 2, 2000, and of U.S. Provisional Patent Application No. 60/232,790 filed Sep. 15, 2000. This application is related to U.S. application Ser. No. 09/835,120 filed Apr. 13, 2001 by John W. Dykes, Joel W. Hoehn, James E. Angelo and William D. Mosley for "Ultrathin Protective Overcoats for Magnetic Materials", the disclosure of which is incorporated herein by reference. This application is also related to U.S. application Ser. No. 09/871,007 filed May 31, 2001 by John W. Dykes, Joel W. Hoehn, James E. Angelo and William D. Mosley for "Process for Production of Ulterthin Protective Overcoats", now U.S. Pat. No. 6,479,111 granted Nov. 12, 2002.

FIELD OF THE INVENTION

This invention relates to protective coatings for objects, and particularly to protective coatings for components in disc drive systems used for the storage and/or retrieval of data, including, for example, read/write heads and storage discs.

BACKGROUND OF THE INVENTION

Advances in many technologies have created enhanced demands on materials used in the production of a variety of devices. Specifically, miniaturization has decreased tolerance levels while increasing performance requirements. Coating technology has become extremely important since coatings can be used to alter the surface properties of the composite while maintaining desirable properties of the underlying substrate. In particular, thin coatings can serve to protect the underlying substrate from a variety of assaults.

Rotating magnetic, optical and optical-magnetic data storage devices use data storage discs with heads mounted to aerodynamic sliders to read data to and/or write data from the disc. The slider includes an air bearing surface that confronts the disc surface. In use, the slider "flies" a predetermined distance above the disc while the disc is spinning at a rapid rate.

Disc drives for data storage can use one or more discs with a medium for the storage of information. In the case of a magnetic or magneto-optical disc drive, the medium includes a relatively thin magnetic layer on a non-magnetic substrate. The data are stored at specific locations along concentric data tracks, usually within data storage zones.

Intermittent contact between the slider and the disc surface causes wear of the disc surface and of the slider. To protect the disc surface and/or the slider from wear and corrosion, overcoats are placed over the magnetic medium on the disc surface and/or the slider surface, including the head. Preferred overcoats reduce wear, friction and oxidation of the slider and disc while maintaining proper aerodynamic interaction between the slider and the disc surface during rotation and during take-off and landing. Protective overcoats are also applied to heads and sliders to protect the head during processing and fabrication.

To obtain higher storage densities on the disc surface, fly heights between the read/write head and the disc surface are being reduced. For example, it is not unusual to require fly heights as small as 10 nanometers (nm) for high density disc drives. Reducing the fly height improves the magnetic interaction between the head and the disc surface to allow correspondingly higher data storage densities. Thus, it is important that protective coatings are thin enough not to excessively increase the effective distance between the magnetic transducers of the head and the magnetic materials near the disc surface. Consequently, where fly heights of 10 nm are required, the protective coating should be thin, preferably not greater than 1 nm.

Carbon coatings have been used to form protective layers on substrates. The coating, however, increases the spacing between the surface and the underlying substrate. Thus, for example in the production of magnetic discs, any performance improvement resulting from a reduction in fly height can be countered by the presence of protective coatings and the like that result in an increased distance between the head and the magnetic medium.

More recently, fullerene has been explored as a potential coating material for magnetic devices such as magnetic discs in a disc drive. U.S. Pat. No. 5,374,463, for example, describes magnetic discs with film coatings formed of multilayer fullerene having a thickness between about 30 and 150 Angstroms (3 to 15 nanometers). However, the multilayer fullerene coatings described therein are simply too thick for present disc drive fly height requirements. The present invention provides a solution to this and other problems, and offers other advantages over the prior art.

SUMMARY OF THE INVENTION

The present invention is directed to a process of forming a coating on a substrate. A multilayer coating of fullerene molecules is deposited on the substrate, and layers of the multilayer coating are removed leaving an approximate monolayer coating of fullerene molecules on the substrate. Preferably, the fullerene is removed while the temperature of the substrate remains below at least about 200° C.

In some embodiments, a beam generator is adjusted to produce a beam arranged to break the fullerene-to-fullerene intermolecular bond of the multilayer coating and inadequate to break the fullerene-to-substrate association/bond of the coating. The beam is directed at the multilayer coating to break the fullerene-to-fullerene intermolecular bond.

In one embodiment, the beam generator is an ion beam generator/ion source that is adjusted to produce a beam having a current density between about 0.05 and 5.0 mA. In other embodiments, the beam generator is a laser beam generator or a gas ion cluster beam generator.

In another embodiment, the monolayer of fullerene molecules is formed by applying a solvent to the multilayer coating. The solvent has a strength adequate to break the fullerene-to-fullerene intermolecular bond of the multilayer coating and inadequate to break the fullerene-to-substrate association/bond of the coating to thereby dissolve the fullerene in the coating that is not bonded to the substrate.

Other features and benefits that characterize the present invention will be apparent upon reading the following detailed description and review of the associated drawings.

BRIEF DESCRIPTION OF THE DRAWINGS

FIGS. 2–4 are illustrations of the apparatus and process of forming fullerene monolayers in accordance with the presently preferred embodiments of the present invention.

DETAILED DESCRIPTION OF ILLUSTRATIVE EMBODIMENTS

Figure 1:
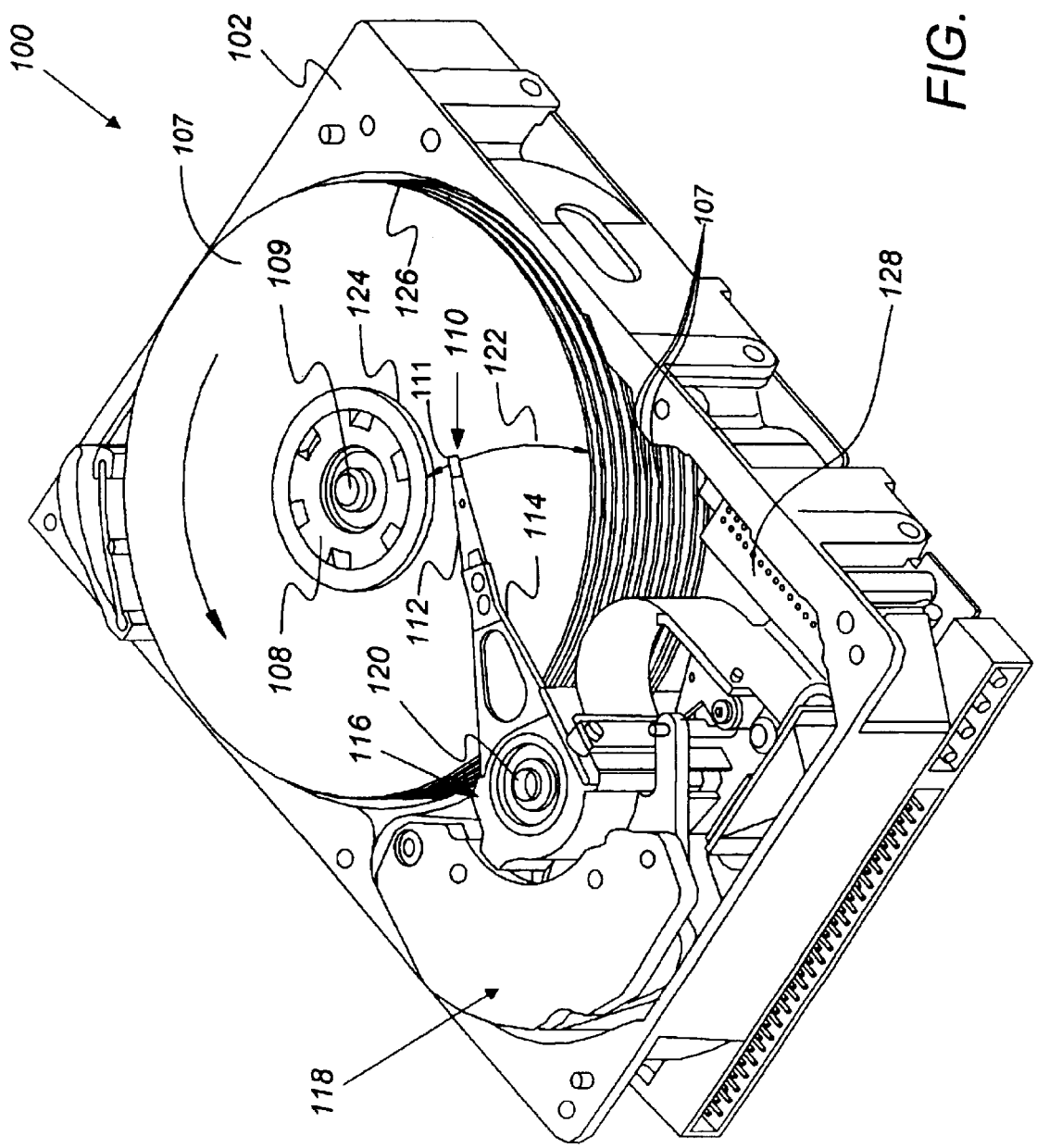
FIG. 1 is a perspective view of a disc drive in which aspects of the present invention may be practiced.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs 107, which are mounted for co-rotation about central axis 109. Each disc surface has an associated disc head-slider 110 that is mounted to disc drive 100 for communication with the confronting disc surface. Head-slider 110 includes a slider structure arranged to fly above the associated disc surface of an individual disc of disc pack 106, and a transducing head 111 arranged to write data to, and read data from, concentric tracks on the confronting disc surface. In the example shown in FIG. 1, head-sliders 110 are supported by suspensions 112 which are in turn attached to track accessing arms 114 of an actuator 116. Actuator 116 is driven by a voice coil motor (VCM) 118 to rotate the actuator, and its attached heads 110, about a pivot shaft 120. Rotation of actuator 116 moves the heads along an arcuate path 122 to position the heads over a desired data track between a disc inner diameter 124 and a disc outer diameter 126. Voice coil motor 118 is driven by servo electronics included on circuit board 128 based on signals generated by the heads of head-sliders 110 and a host computer (not shown). Read and write electronics are also included on circuit board 128 to supply signals to the host computer based on data read from disc pack 106 by the read heads of head-sliders 110, and to supply write signals to the write head of head-sliders 110 to write data to the discs.

Rotation of discs 107 by the spindle motor in the direction of arrow 132 generates wind along the surface of the disc. Sliders 110 react with the wind to "fly" a design distance from the surface of the respective disc.

The aforementioned Dykes et al. application describes ultrathin protective coatings comprising a monolayer of purified fullerene material on a clean metal or semiconductor substrate surface such that the fullerenes are strongly bonded to the surface. The fullerene-metal/semiconductor attraction is stronger than the fullerene-fullerene attractions between layers. $C_{60}$ fullerene is the preferred coating material due to its strong adherence to the substrate and relative availability. Fullerenes are carbon cluster molecules with an open cage structure characterized by four to six sided polygons or rings along the surface of the molecule. In one form, the $C_{60}$ molecules are spherical, somewhat resembling a soccer ball, and are sometimes referred to as having a "soccer ball" molecular structure. Well known fullerenes include, for example, $C_{60}$ (buckminster fullerene, also known as "buckyballs"), $C_{70}$, $C_{80}$ and $C_{84}$. Fullerene molecules have a diameter in the range of about 5 Angstroms to about 10 Angstroms (0.5 to about 1.0 nanometer).

Fullerene molecules exhibit very strong adhesion to clean metal and semiconductor surfaces, resist corrosion and provide reasonable tribologic properties. The fullerene molecules form stronger bonds to clean metal or semiconductor substrates than they form to other fullerene molecules.

As described herein, a coating of fullerene generally is formed on the metal or semiconductor substrate. The coating may be formed by depositing the fullerene molecules onto the substrate. It is important that the substrate be clean and free of contaminants that may interfere with the formation of strong attraction between the fullerenes and a clean metal/semiconductor surface. For example, oxides on the substrate surface can diminish the strength of the association/bond between the fullerene molecules and metal or semiconductor substrate. Approaches to meet the requirement for a clean deposition surface is described in the aforementioned Dykes et al. application where a $C_{60}$ fullerene coat is deposited onto a clean object containing a magnetic material at an operating pressure less than about $10^{-7}$ torr. The low pressure assures an adequate absence of oxygen and water. More particularly, the low pressure assures that the partial pressures of both oxygen and water are in an ultra high vacuum condition, below about $10^{-9}$ torr. A clean metal or semiconductor surface is obtained, for example, by forming the surface under a high vacuum by processes such as chemical or vapor deposition, or by cleaning the surface under a high vacuum with a sputtering or other process.

The fullerene molecules attach to the clean metal or semiconductor substrate with a strength that exceeds that of the intermolecular fullerene-to-fullerene bonding. The strength of fullerene bonding to another object can be estimated by the temperature at which the fullerene molecules desorb or evaporate from the condensed phase at the surface. The desorption temperature is related to the association/bond strength between the fullerene and the surface. Greater desorption temperatures are indicative of stronger associations, and vice versa. For some surfaces, the surface and the fullerenes may react at a temperature lower than the desorption temperature, in which case the reaction temperature provides a lower limit on the bond strength.

In the case of multilayer fullerene coatings, that is fullerene coatings having multiple layers of fullerene molecules as a coating, the initial desorption temperature is indicative of the fullerene-to-fullerene intermolecular bond strength. The desorption temperature of the fullerene-to-fullerene bond is generally between 500 K and 570 K. The desorption temperature corresponding to fullerene-to-metal/semiconductor attraction, which is indicative of the association/bond strength of the attraction of fullerene molecules to the metal or semiconductor surface, is 625 K to 725 K and higher.

A fullerene coating can be applied to a substrate using a collection of fullerenes. In preferred embodiments, the fullerenes are applied to a clean metal or semiconductor surface. In one embodiment, the fullerenes are applied to a surface within a vacuum chamber by forming a vapor of fullerenes by heating a source of fullerenes to form a vapor by sublimation. This approach is described further in the Dykes et al. application. An approach for producing a vapor of fullerenes by sputtering a fullerene target with an electron beam is described in a copending and simultaneously filed patent application to Dykes et al. entitled "Process For Production Of Ultrathin Protective Overcoats."

Regardless of the approach used to deposit the fullerenes on the substrate surface, more than a monolayer of fullerenes may be deposited. Multiple layers of fullerenes add additional unwanted thickness to the protective layer. In addition, the additional layers of fullerenes are not stable since the fullerene-fullerene intermolecular attraction is significantly lower than the strong attraction between the fullerenes and clean metal or semiconductor surfaces.

While it may be possible to control the deposition time and conditions to directly deposit a monolayer, it may be difficult to control the deposition conditions to comfortably produce a monolayer. If more than a monolayer is deposited, it is desirable to remove the additional layers of fullerenes while leaving the strongly adhered monolayer on the clean metal or semiconductor surface. To remove the additional fullerenes, the coated substrate can be heated to a temperature to desorb the multiple layers of fullerenes without disrupting the monolayer, as described further below. This selective desorption is possible due to the stronger association/bonding of the fullerenes to the clean metal or semiconductor surface relative to the fullerene-fullerene intermolecular bonding.

In the Dykes et al. application, a monolayer coating of fullerene is formed by heating the coated object to above about 500 K to 570 K and below about 625 K to desorb excess fullerenes by rupturing the fullerene-to-fullerene intermolecular bond without rupturing the fullerene-to-metal association/bond. By heating the coating to between 500 K (about 225° C.) and 625 K (about 350° C.), the coating is reduced to approximately a monolayer coating. The thickness of the resulting monolayer of fullerene is between about 5 to 10 Angstroms (0.5 to 1.0 nanometers), which results in an ultrathin protective overcoat for the object. However, many components, such as the head-slider component of the disc drive, can not withstand temperatures of up to 225° C. required for desorption of the fullerene-to-fullerene bond. Some magnetic heads cannot withstand temperatures in excess of about 150° C. without suffering adverse effects that adversely affect the performance of the head. The present invention is directed to a process to achieve breaking of the fullerene-to-fullerene intermolecular bond to reduce multilayer coatings to monolayer coatings, without subjecting the object to high temperatures that might be injurious to the object.

In accordance with the present invention, an approximate monolayer fullerene coating is achieved from multilayer coatings by techniques that break the fullerene-to-fullerene intermolecular bond without breaking the fullerene-to-substrate association/bond and without subjecting the substrate to injurious temperatures. More particularly, a laser beam, ion beam, electron beam, solvent or other technique is employed to break the fullerene-to-fullerene intermolecular bond to achieve a monolayer coating on the substrate.

While the present invention is described as achieving monolayer coatings, those skilled in the art will recognize that establishing the presence of an absolute single layer is problematic. Consequently, as used herein, the term "monolayer" as applied to a coating of fullerene means a coating having approximately one layer of fullerene molecules, although the properties of the coating are not significantly affected if the coating is slightly more or less than a monolayer. Moreover, while a monolayer of fullerene molecules generally packs into a two-dimensional crystalline structure on the substrate, a fullerene coating with minor lattice defects in the monolayer may not alter the desirable properties of the fullerene layer and would be considered an approximate monolayer. In any case, the fullerene monolayer protects the substrate from corrosion due to water vapor and wear and may provide satisfactory lubrication with an ultrathin layer suitable for use in magnetic data storage components, such read/write heads, sliders and magnetic discs.

Fullerenes can be synthesized using various methods and some fullerenes have been well characterized. Fullerenes are commercially available from a variety of sources, including SES Research of Houston, Tex. The fullerenes are purified, such as by column chromatography of organic dispersions of fullerenes, such as with silica or alumina columns. The purified fullerenes are deposited onto a clean substrate. One way to meet the requirement for a clean deposition environment is by forming the substrate under a high vacuum by processes such as chemical or vapor deposition, or by cleaning the substrate under a high vacuum with a sputtering or other process.

One technique for depositing fullerenes onto the clean substrate is described in the Dykes et al. application, wherein fullerene material that has been purged of residual solvent and other impurities is heated to a temperature between about 450° C. and 550° C. in a vacuum chamber operated at a pressure from about $10^{-7}$ torr to about $10^{-10}$ torr and generally less than about $10^{-8}$ torr. The fullerene molecules are deposited onto the substrate in the vacuum chamber by sublimation. Ultrahigh vacuum maintains a clean surface for the deposition of fullerenes.

The selection of a substrate material on which the fullerene is deposited also depends on the specific use and performance parameters of the coated object. The substrate will be a clean metal, semiconductor or combination thereof. For magnetic heads, suitable substrate materials include, for example, Ni, Co, NiFe, CoFe, CoZrNb, NiFeCr, AlSiFe, NiFeRe, combinations thereof and alloys thereof. For magnetic discs, suitable substrate materials include metals, such as cobalt and cobalt alloys, e.g., Co—Ni, Co—Cr, Co—Ni—Fe, Co—Ni—Cr, Co—Pt, Co—Ni—Pt, Co—Cr—Ta, Co—Cr—Pt, Co—Cr—Ni—B, Co—P, Co—Ni—P, other similar materials, combinations thereof and alloys thereof. Other metals and alloys include, for example, PtMn, Cu, Ru, Rh, Ta, CoPt, CoCuPt, Au, and the like. For magneto-optical discs may include one or more rare earth elements and one or more transition metals, for example, TbFeCo, GdFeCo, TbFeCoZr, DyFeCo, and GdDyFeCo.

FIG. 2 illustrates a multilayer coating 200 of fullerene molecules 204 deposited onto a substrate 202. As explained in the aforementioned Dykes et al. application, substrate 202 is a metal or semiconductor substrate that is substantially free of contaminants prior to deposition of the fullerene molecules. The bottom monolayer of fullerene molecules is strongly bonded to surface 206 of substrate 202. For example, the fullerene-to-substrate attraction strength is at least about 35 kilocalories/mole and is usually above about 40 kcal/mol. The desorption temperature of the fullerene-to-substrate monolayer is above about 625 K, and usually above about 700 K (about 425° C.). Conversely, the fullerene-to-fullerene bond is weaker, exhibiting a desorption temperature between about 500 K and 570 K (225° C.–300° C.).

One embodiment of the invention, illustrated particularly in FIG. 3, employs a beam source 250 arranged to direct a beam 252, such as energetic photons (in the case of a laser beam or other intense light), electrons (in the case of an electron beam) or inert ions (in the case of an ion beam) at substrate 202. Source 250 produces a beam 252 that has sufficient energy to energize the fullerene molecules on the surface of substrate 202 to a level adequate to break the fullerene-to-fullerene intermolecular bond of multilayer coating 200, but not adequate to break the fullerene-to-substrate association/bond. The individual photons, electrons or ions deliver non-reactive amounts of energy so as to not decompose the fullerene molecules or otherwise cause them to react. Power density is also low enough so that local heating due to the energy flux is not excessive. The substrate surface generally is heated to temperatures less than about 200° C., in other embodiments less than about 150° C. and in other embodiments no more than about 100° C. The exact parameters of the beam are dependent upon the energy, flux and duration of the beam and may also depend on the angle θ of the beam to the fullerene lattice on the substrate. In preferred embodiments, beam 252 is focused on a small area of the multilayer to allow heat from the beam to dissipate through the substrate to a heat sink or coolant, without heating the substrate to injurious levels. More particularly, where the substrate is part of an object that could be adversely affected by raised temperature, such as some magnetic heads, the beam energy and size are chosen to allow heat to dissipate through the substrate and be removed from the substrate without injuring the substrate.

Beam 252 can be moved as indicated by arrow 254 in swaths so that the beam will ultimately impinge the entire exposed surface of the multilayer coating or the relevant portion thereof. The relative motion can be used to contact the beam with selected portions of the substrate. In some cases, beam generator 250 is moved relative to the substrate. In other cases, it may be more convenient to move substrate 202 relative to the beam generator, especially where the substrate might be repositioned relative to the beam for successive swaths. The beam breaks the fullerene-to-fullerene intermolecular bond, thereby reducing the multilayer fullerene coating to a monolayer fullerene coating.

In preferred embodiments the process of forming the monolayer is conducted in the same vacuum chamber where the substrate surface was cleaned and the fullerene deposited. This has the advantage of maintaining the substrate clean and in an atmosphere that is free of oxygen. In addition, maintaining the substrate under vacuum reduces the scattering of the beam by atmospheric gases and correspondingly decreasing the efficiency of the process for forming a monolayer. The presence of a vacuum also removes the fullerenes desorbed from the surface from recondensing back onto the surface. Moreover, the process of forming the monolayer may be conducted at room temperature. The power level and duration of the beam should be adequate to break the fullerene-to-fullerene intermolecular bond without adversely affecting the fullerene-to-substrate association/bond.

In the case of a laser beam, the frequency and operation of the laser should be adjusted to avoid reacting the fullerene molecules. For example, under various conditions, laser energy in the ultraviolet range may cause disassociation of the fullerene into graphite; under other conditions, laser energy in the ultraviolet range might generate higher-ordered fullerenes. Should these conditions be employed, it may be necessary to operate the laser frequency to below the ultraviolet range and in the visible or infrared range. Under other operating conditions (temperature, pressure, pulsating operation of the laser, etc.), the laser energy in the ultraviolet range may provide better results of breaking the fullerene-to-fullerene intermolecular bond while not adversely affecting the fullerene-to-substrate association/bond. Under these conditions, it may be desirable to operate the laser in the ultraviolet range.

In preferred embodiments, the laser or other light source operates in the visible or infrared portion of the spectrum. The light intensity and beam size can be adjusted to produce the desired desorption rate of fullerenes beyond a monolayer while maintaining the overall temperature of the substrate at desired temperatures. The substrate can be cooled by contacting the substrate with a cooling system such as a circulating liquid bath with an enclosed cooling coils or by blowing cool inert gas past the substrate.

In alternative embodiments, an electron beam is used to remove excess fullerenes. Generally, the beam energy should be less than about 1 kilovolt, and more preferably from about 250 volts to about 25 volts. The current of the electron beam generally is from about 0.01 to about 1 amperes, and in some embodiments is from about 0.05 to about 0.2 amperes. The properties of the beam, especially the beam current, can be selected based on the beam size and the rate at which the beam is scanned across the surface. The electron beam properties can be selected such that the fullerene monolayer adjacent the substrate surface is not disrupted while the additional fullerene layers are removed.

In the case of an ion beam, the ion energy and the beam flux should be low enough to avoid decomposing the fullerene or forming higher-ordered fullerene molecules. An ion beam can be generated, for example, by bombarding a molecular flow with high energy electrons that result in ionization of the molecules. The resulting ion beam can be directed using electrodes to direct the ion beam. In some embodiments, the acceleration voltage should be between about 100 and 300 volts, although under some circumstances the voltage may be as high as 3.0 kilovolts. Ordinarily, the beam current density will be in the range of about 0.05 to 5.0 mA/cm$^2$ (milliAmperes per square centimeter), although the current density will, in part, be affected by other operating parameters (pressure, temperature, etc.). Higher energy ion beams should be avoided because of the risk that the beam might decompose the fullerene.

In some embodiments, a gas cluster ion beam may be employed using ion clusters having an atomic mass approximating that of the fullerene molecules. More particularly, a $C_{60}$ fullerene molecule has an atomic mass unit (AMU) of 720. Most ions have significantly smaller AMUs (Argon ions have an AMU of 40, for example). By employing beams of clustered ions, clusters approximating the mass of the fullerene molecules can be used to inject energy into the multilayer fullerene coating to thereby break the fullerene-to-fullerene intermolecular bond of the multilayer to form a fullerene monolayer on a metal or semiconductor substrate surface. Clusters can be formed by expanding an inert gas, such as argon, through a supersonic nozzle. Cooling upon expansion through the nozzle results in cluster formation. Ions can be formed following cluster formation using an electron beam or an electric arc. In an alternative embodiment, fullerene molecules themselves can be ionized to form a fullerene ionic beam.

In some embodiments, the beam is directed at angle θ to surface 206 of the substrate 202 to break the fullerene-to-fullerene intermolecular bond of the fullerene crystal structure from the upper layers of the coating. Angle may be selected to control beam concentration on the substrate, or to impart motion to the fullerene, especially in the case of an ion beam. For example, a beam angle relative to the surface between about 25° and 75°, or in other embodiments between about 40° and about 65°, may be employed. In sputtering/ion milling generally and in the present case, selection of the angle involves a balance of factors such as removal efficiency and selective removal of only desired material. In the present embodiments, the beam should not remove the monolayer. Higher energy beams may have a more glancing angle. A person of skill in the art can select a preferred angle by empirical adjustment along with the beam energy and the amount of time that the beam is directed.

FIG. 4 illustrates the completed substrate 200 having a monolayer 210 of fullerene $C_{60}$ deposited on surface 206. Through use of the laser or ion beam technique, the monolayer of $C_{60}$ is formed from a multilayer without heating substrate 202 to injurious levels. This feature is particularly advantageous in the coating of sliders, magnetic heads and other devices that might not withstand heating to a desorption temperature of 225° C. to 300° C. or higher.

In a second embodiment, instead of employing a beam generator to break the bond between the fullerene molecules, a solvent, such as hexane, toluene, benzene, carbon tetrachloride, carbon disulphide, or mixtures thereof, may be employed to dissolve the upper layers of multilayer coating 200, resulting in the monolayer 210 illustrated in FIG. 4. An ultrasonic agitator may be used to agitate the solvent using an ultrasonic transducer, such as a piezoelectric transducer, while the solvent is contacting the fullerene. The ultrasonic agitator is particularly useful where the substrate has an irregular shape. The solvent and contact time with the fullerene coated object are selected to remove the upper layers of fullerene, leaving a monolayer of fullerene molecules on the substrate. Preferably, the solvent is volatile so than any remaining solvent evaporates. The process is preferably carried out at a temperature below about 100° C., and most preferably at room temperature. Consequently, the substrate on which the fullerene monolayer is formed is not subjected to temperatures that might otherwise be injurious to the substrate, or the object form by the substrate. Hence, the process is well suited to forming fullerene monolayers on magnetic heads and head-slider combinations for use in magnetic disc drives.

The surface of a data storage disc can optionally further include a lubricant layer over the fullerene protective monolayer. Suitable lubricant layers include polymer, for example, fluorinated polymers, such as perfluoropolyethers and derivatives thereof. Suitable perfluoropolyethers polymers include, for example, Fomblin® Z-60 (average molecular weight (AMW)=about 60,000 atomic mass units (AMU) or Daltons), Fomblin® Z-25 (AMW=about 25,000 AMU) and Fomblin® Z-15 (AMW=about 15,000 AMU). The Fomblin® perfluoropolyethers made by Montedison (Ausimont) S.P.A., Milan, Italy have molecular formulas of $CF_3O(CF_2CF_2O)_n(CF_2O)_mCF_3$, where n and m vary to yield particular products with average molecular weights of specified values.

In particularly preferred embodiments, both the head surface and the disc surface have a fullerene monolayer. Due to the weak interactions between fullerene molecules, the fullerene coated head should not stick strongly to the fullerene coated substrate. For these embodiments in particular, a lubricant layer on the substrate surface may not be needed to obtain desired tribologic performance.

The present invention is directed to a process of forming a coating on a substrate. A multilayer coating (200) of fullerene molecules is deposited on the substrate (202), and layers of the multilayer coating are removed leaving an approximate monolayer coating (210) of fullerene molecules on the substrate.

In some embodiments, a beam generator (250) is adjusted to produce a beam (252) arranged to break the fullerene-to-fullerene intermolecular bond of the multilayer coating and inadequate to break the fullerene-to-substrate association/bond of the coating. The beam is directed at the multilayer coating to break the fullerene-to-fullerene intermolecular bond. Examples of the beam generator include an ion beam generator, an electron beam generator and a laser beam generator.

In other embodiments, the monolayer of fullerene molecules is formed by applying a solvent to the multilayer coating. The solvent has a strength adequate to break the fullerene-to-fullerene intermolecular bond of the multilayer coating and inadequate to break the fullerene-to-substrate association bond of the coating to thereby dissolve the fullerene in the coating that is not bonded to the substrate. The solvent is selected from the group consisting of hexane, toluene, benzene, carbon tetrachloride, carbon disulphide and mixtures thereof.

Although the present invention has been described with reference to overcoats for magnetic objects, such as head/sliders and discs of a magnetic or magneto-optical disc drive, those skilled in the art will recognize that the present invention may be practiced with other components, including but not limited to bearings used in the spindle and voice coil motors of the drive, as well as to other systems employing coatings and lubrication technologies, particularly where ultra-thin coatings are required.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of the structure and arrangement of the coating and the manner of reducing multilayer coatings, and remain within the principles of the present invention to the full extent indicated by the broad general meaning of the terms in which the appended claims are expressed. For example, particular elements may vary depending on the particular application for the protective coating while maintaining substantially the same functionality without departing from the scope and spirit of the present invention. Thus, while the invention is described in connection with fullerene coatings, the process of reducing multilayer coatings to monolayer coatings might be accomplished in a variety of ways without adversely raising the temperature of the coated object, such as mechanically or chemically. Moreover, while the invention is described in connection with $C_{60}$ fullerene, the principles are fully applicable to other higher fullerenes, such as $C_{76}$, $C_{78}$, $C_{84}$, $C_{90}$, $C_{94}$, $C_{96}$ and any other fullerene or molecule with fullerene-like properties. Although the invention is described herein is directed to a specific technique to achieve monolayer coatings, it will be appreciated by those skilled in the art that the teachings of the present invention can be applied to formation of controlled multilayer coatings, without departing from the scope and spirit of the invention.

What is claimed is:

1. A process of forming a coating on a substrate, the process comprising the steps of:
    a) forming a coating on the substrate comprising initially a plurality of layers of fullerene molecules; and
    b) removing layers of the fullerene molecules, while maintaining a temperature of the substrate at no more than about 200 degrees C., leaving an approximate monolayer coating of fullerene molecules on the substrate.

2. The process of claim 1, wherein the temperature of the substrate is maintained no more than about 150° C. during the removal of layers of fullerene molecules from the coating.

3. The process of claim 1, wherein the temperature of the substrate is maintained no more than about 100° C. during the removal of layers of fullerene molecules from the coating.

4. The process of claim 1, wherein the substrate is formed of a material selected from the group consisting of metals and semiconductors and combinations thereof.

5. The process of claim 1, wherein the substrate is formed of a material selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, PtMn, Cu, Ru, Rh, Ta, CoPt, CoCuPt, Au, rare earth elements, transition metals, mixtures thereof, and alloys thereof.

6. The process of claim 1, wherein the fullerene molecules are bonded to the coating surface with a bond strength corresponding to a fullerene desorption temperature from the monolayer of at least about 700 K.

7. The process of claim 1, wherein the fullerene comprises $C_{60}$.

8. The process of claim 1, wherein the layers of fullerene are removed by breaking the fullerene-to-fullerene intermolecular bond of the coating using a technique selected from the group consisting of applying beams and applying solvents to the coating.

9. A process of forming a coating on a substrate, the process comprising steps of:
   a) forming a coating on the substrate comprising a plurality of layers of fullerene molecules;
   b) adjusting a beam generator to produce a beam arranged to break the fullerene-to-fullerene intermolecular bond of the coating and inadequate to break the fullerene-to-substrate association/bond of the coating; and
   c) directing the beam at the coating to break the fullerene-to-fullerene intermolecular bond while maintaining a temperature of the substrate at no more than about 200 degrees C., leaving an approximate monolayer coating of fullerene molecules on the substrate.

10. The process of claim 9, wherein the beam generator is an ion beam generator.

11. The process of claim 9, wherein the beam generator is a gas cluster ion beam generator.

12. The process of claim 9, wherein the beam generator is a laser beam generator.

13. The process of claim 12, wherein the laser beam generator produced a laser frequency below the ultraviolet frequency range.

14. The process of claim 9, wherein the beam generator is an electron beam generator.

15. The process of claim 9, wherein step (c) includes:
   directing the beam at an acute angle to the substrate.

16. The process of claim 15, wherein the angle is between about 40° and 65°.

17. The process of claim 9, wherein step (c) further includes steps of:
   i) focusing the beam so that the beam impinges less than all of the coating, and
   ii) moving the beam generator relative to the substrate so that the beam successively impinges substantially the entire coating.

18. The process of claim 9, wherein step (c) includes
   i) focusing the beam so that the beam impinges less than all of the coating, and
   ii) moving the beam generator relative to the substrate so that the beam successively impinges selected portions of the coating.

19. The process of claim 9, wherein the temperature of the substrate is maintained no more than about 150° C. during the removal of layers of fullerene molecules from the coating.

20. The process of claim 9, wherein the temperature of the substrate is maintained no more than about 100° C. during the removal of layers of fullerene molecules from the coating.

21. The process of claim 9, wherein the substrate is formed of a material selected from the group consisting of metals and semiconductors and combinations thereof.

22. The process of claim 9, wherein the substrate is formed of a material selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, PtMn, Cu, Ru, Rh, Ta, CoPt, CoCuPt, Au, rare earth elements, transition metals, mixtures thereof, and alloys thereof.

23. The process of claim 9, wherein the fullerene molecules are bonded to the coating surface with a bond strength corresponding to a fullerene desorption temperature from the monolayer of at least about 700 K.

24. The process of claim 9, wherein the fullerene comprises $C_{60}$.

25. A process of forming a coating on a substrate, the process consisting essentially of the steps of:
   a) forming a coating on the substrate comprising a plurality of layers of fullerene molecules;
   b) applying a solvent to the coating at no more than about 200 degrees C. for a period of time adequate to break the fullerene-to-fullerene intermolecular bond of the coating and inadequate to break the fullerene-to-substrate association/bond of the coating to thereby remove the fullerene molecules from the coating that are not bonded to the substrate; and
   c) removing the solvent leaving an approximate monolayer coating of fullerene molecules on the substrate.

26. The process of claim 25, wherein the temperature of the substrate is not greater than 150° C. during application of the solvent.

27. The process of claim 25, wherein the solvent is selected from the group consisting of hexane, toluene, benzene, carbon tetrachloride, carbon disulphide, and mixtures thereof.

28. The process of claim 25, wherein the temperature of the substrate is maintained no more than about 100° C. during application of the solvent.

29. The process of claim 25, wherein the substrate is formed of a material selected from the group consisting of metals and semiconductors and combinations thereof.

30. The process of claim 25, wherein the substrate is formed of a material selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, PtMn, Cu, Ru, Rh, Ta, CoPt, CoCuPt, Au, rare earth elements, transition metals, mixtures thereof, and alloys thereof.

31. The process of claim 25, wherein the fullerene molecules are bonded to the coating surface with a bond strength corresponding to a fullerene desorption temperature from the monolayer of at least 700 K.

32. The process of claim 25, wherein the fullerene comprises $C_{60}$.

* * * * *